US007002365B2

(12) United States Patent
Kakizawa et al.

(10) Patent No.: US 7,002,365 B2
(45) Date of Patent: Feb. 21, 2006

(54) METHOD AND AN APPARATUS FOR TESTING TRANSMITTER AND RECEIVER

(75) Inventors: Akira Kakizawa, Phoenix, AZ (US); Ronald W. Swartz, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/749,629

(22) Filed: Dec. 30, 2003

(65) Prior Publication Data

US 2005/0146346 A1    Jul. 7, 2005

(51) Int. Cl.
*G01R 31/26* (2006.01)
(52) U.S. Cl. .................... 324/763; 324/765; 324/73.1; 714/724
(58) Field of Classification Search ........... 324/73.1, 324/763–769, 158.1; 438/14–18; 714/724, 714/733; 327/62–67
See application file for complete search history.

(56) References Cited

U.S. PATENT DOCUMENTS

| 6,150,831 A * | 11/2000 | Asai et al. ................ 324/765 |
| 6,566,857 B1 | 5/2003 | Kakizawa et al. |
| 6,725,406 B1 | 4/2004 | Kakizawa et al. |
| 6,762,614 B1 * | 7/2004 | Rearick et al. ............ 324/763 |
| 6,809,541 B1 * | 10/2004 | Bu et al. .................. 324/765 |
| 6,876,218 B1 * | 4/2005 | Simmons et al. .......... 324/763 |
| 2003/0005374 A1 | 1/2003 | Fought et al. |

* cited by examiner

*Primary Examiner*—Minh N. Tang
(74) *Attorney, Agent, or Firm*—Blakely, Sokoloff, Taylor & Zafman LLP

(57) ABSTRACT

A method and an apparatus for testing transmitter and receiver have been disclosed. One embodiment of the apparatus includes a plurality of multiplexers to select one of a positive transmitter pin and a negative transmitter pin, and a first comparator to compare a voltage of the selected pin with a first reference voltage to determine whether leakage exists at the selected pin. Other embodiments are described and claimed.

11 Claims, 4 Drawing Sheets

METHOD AND AN APPARATUS FOR TESTING TRANSMITTER AND RECEIVER

FIELD OF INVENTION

The present invention relates to semiconductor devices, and more particularly, to testing input/output of semiconductor devices using on-die design-for-testing circuitry.

BACKGROUND

In a typical computer system, some components are coupled to a device of a chipset via serial buses. The chipset acts as an interface between the components and a processor. As the processor speed increases, the speed of the serial interfaces of the chipset devices has to increase in order to keep up with the processor speed. The speed of a serial interface is typically several times of the speed of the processor.

With the advent of high-speed serial interface, the design of the interface has become increasingly complicated, and therefore, a more sophisticated and robust testing technique is necessary to test the interface. The conventional method of measuring signals using an external tester is inadequate for fully testing a high-speed serial interface because the speed of legacy testers is limited. Furthermore, the limited number of tester channels in the legacy testers poses another problem in testing the chipset device because there may not be enough tester channels to test every pin of the chipset device as the complexity of the chipset device increases. Because of the limited number of tester channels and the high-speed tests, the transmitter and the receiver of the device are connected on a load board during some high-speed data transfer tests. However, it is still difficult to test for leakage at the pins and/or other parts of the device limited number of tester channels.

Alternatively, some semiconductor manufacturers replace the legacy testers with high-speed testers in order to provide more tester channels and to speed up the measurement of small signals during testing. However, replacing the legacy testers with the high-speed testers significantly increases the cost of manufacturing chipset devices with high-speed serial interface because the high-speed testers are very expensive.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 1:
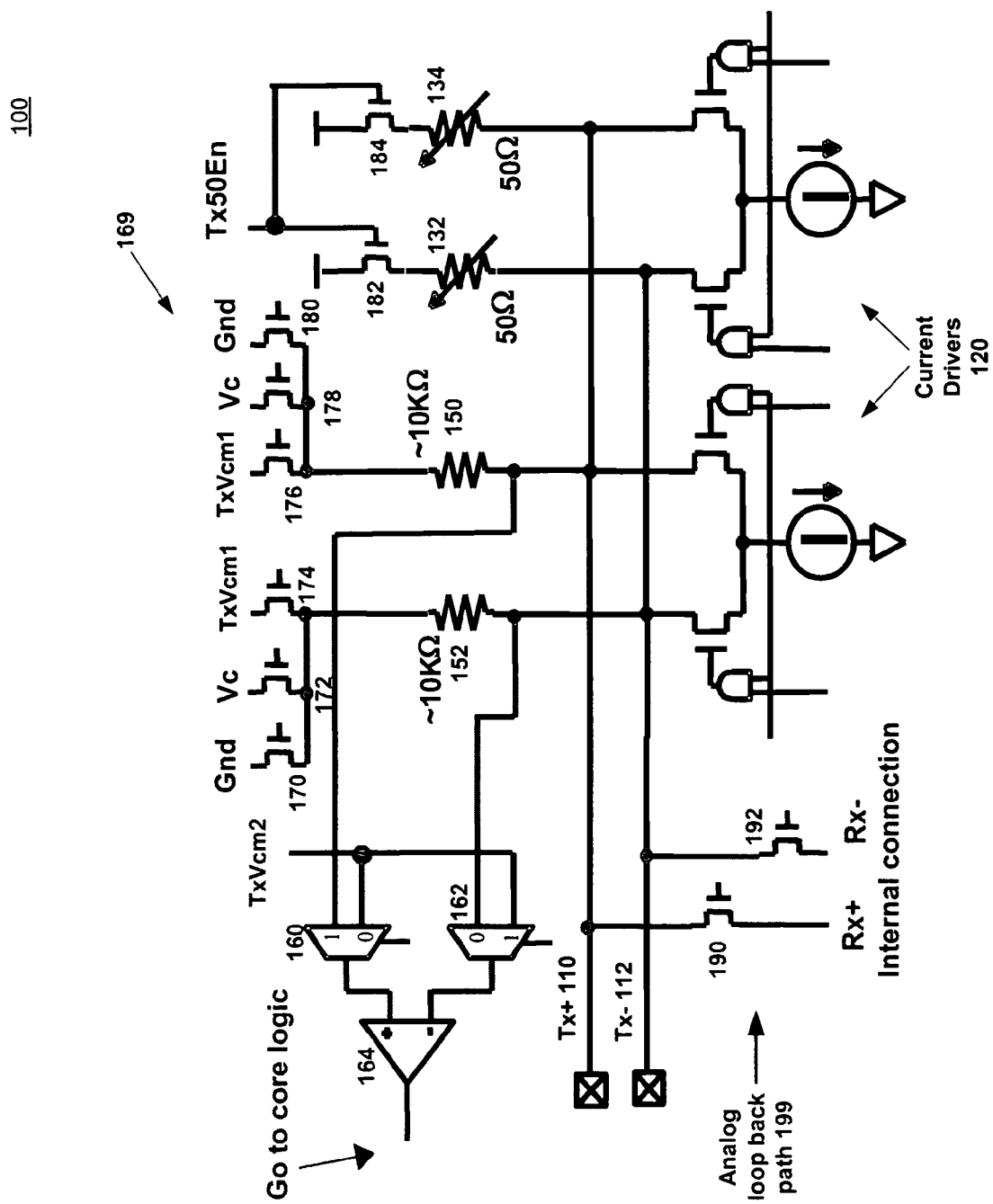
FIG. 1 shows one embodiment of testing circuitry coupled to a transmitter.

FIG. 1 shows one embodiment of a transmitter 100 in an input/output interface of a semiconductor device with on-die design-for-testing (DFT) circuitry. The input/output interface may be a serial interface or a parallel interface. The transmitter 100 includes a positive transmitter pin 110, a negative transmitter pin 112, two current drivers 120, two resistors 150 and 152, and a number of termination resistors 132 and 134. Each of the positive and negative transmitter pins 110 and 112 is coupled via one of the resistors 150 and 152 to a power supply selected from the group of power supplies 169. The termination resistors 132 and 134 may be variable resistors. In one embodiment, each of the termination resistors has a resistance of 50 ohms.

Referring to FIG. 1, the DFT circuitry includes a comparator 164, two multiplexers 160 and 162, and a number of transistors 170–184. The transistors 182 and 184 couple the variable termination resistors 132 and 134, respectively, to a power supply so that the termination resistors 132 and 134 may be isolated from the power supply during certain transmitter tests. Furthermore, the transistors 170–180 act as switches to allow the selection of two voltage supplies out of a group of voltage supplies 169. The group of voltage supplies 169 may include Vcc, ground, or a transmitter common mode voltage (TxVcm1). The two selected voltage supplies are coupled to the resistors 150 and 152.

The resistors 150 and 152 are further coupled to the positive and negative transmitter pins 110 and 112 respectively. The voltages at the transmitter pins 110 and 112 are input to the multiplexers 160 and 162 respectively. A second transmitter common mode voltage, TxVcm2 is also input to both multiplexers 160 and 162. One should appreciate that TxVcm2 may or may not be the same as TxVcm1. In one embodiment, both TxVcm1 and TxVcm2 are variable voltage supplies, which may be set at different values. The multiplexers 160 and 162 are configured such that one of the multiplexers 160 and 162 outputs TxVcm2 while the other multiplexer outputs the voltage of one of the transmitter pins 110 and 112. The outputs of the multiplexers 160 and 162 are input to the comparator 164. Therefore, the multiplexers 160 and 162 allow the comparator 164 to compare one of the voltages of the transmitter pins 110 and 112 with TxVcm2. The output of the comparator 164 may go to the core logic (not shown) of the semiconductor device. In response to the output of the comparator 164, the core logic may output a signal to indicate whether there is leakage at the transmitter pins 110 and 112. In addition to, or as an alternative to, outputting the signal, the core logic may perform other operations in response to the output of the comparator 164. Details of one embodiment of the transmitter pin leakage test are discussed below.

In addition to the multiplexers 160 and 162, the transmitter pins 110 and 112 are each coupled to the corresponding receiver pins via the transistors 190 and 192 respectively. This is also known as an analog loop back path 199 from the transmitter to the receiver. The analog loop back path 199 allows the semiconductor device to perform a self-test on the transmitter and the receiver of the semiconductor device without using an external load board to provide a data loop back path. In one embodiment, the transmitter pins 110 and 112 send certain predetermined data patterns to the receiver pins to test the transmitter and/or the receiver.

In addition to, or as an alternative to, the self-test, various input/output tests may be performed using the DFT circuitry, such as, for example, a transmitter termination resistor test, a transmitter current driver test, a test on the resistors 150 and 152 of the transmitter, and a transmitter pin leakage test. To illustrate the concept, some embodiments of the transmitter tests are described in details below.

In one embodiment, to perform the transmitter pin leakage test, deactivating the transistors 182 and 184 cuts off the power supply to the termination resistors 132 and 134. Activating and/or deactivating the appropriate transistors 170–180 may select one of the voltage supplies 169. For instance, TxVcm1 can be selected to charge up the positive transmitter pin by activating the transistor 176 and deactivating the transistors 178 and 180. After charging up the voltage at the positive transmitter pin 110, the multiplexers 160 and 162 select the voltage of the positive transmitter pin 110 and TxVcm2 as a reference voltage to input to the comparator 164. The comparator 164 compares the selected voltages. If the voltage of the transmitter pin 110 drops below TxVcm2, there is leakage at the positive transmitter pin 110. Likewise, the negative transmitter pin 112 can be charged up and compared to TxVcm2. If the voltage of the negative transmitter pin 112 rises above TxVcm2, then there is leakage at the negative transmitter pin 112.

Figure 3:
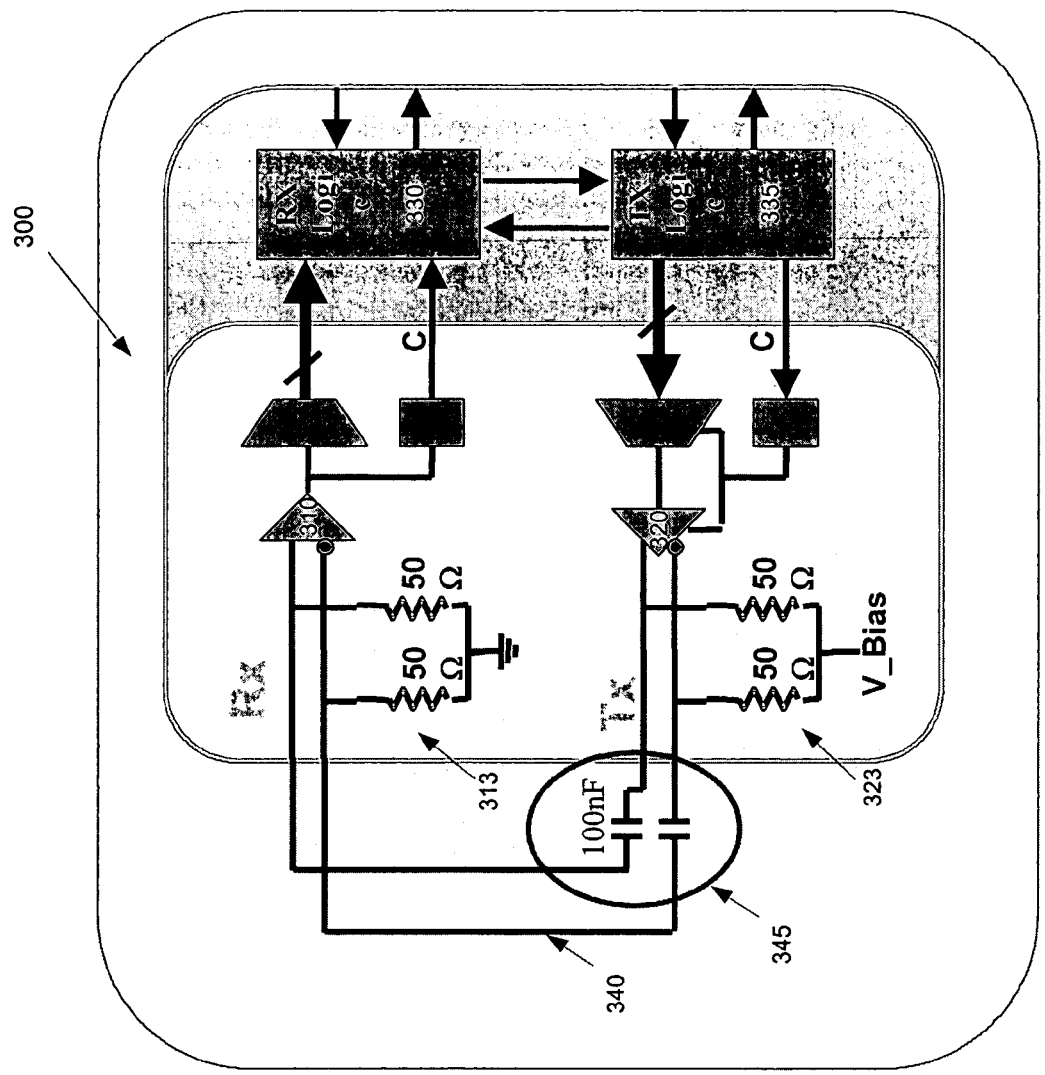
FIG. 3 shows one embodiment of a semiconductor device having an external loop back path.

Furthermore, the termination resistors 132 and 134 may be tested with the DFT circuitry as well with external capacitors 345 on the transmitter pins 110 and 112 as shown in FIG. 3. The transistors 170–180 may be deactivated to cut off the voltage supplies 169. The transistors 190 and 192 are also deactivated to cut off the analog loop back path 199. The transistors 182 and 184 are deactivated and then activated to provide a voltage supply on the transmitter pins 110 and 112 via the termination resistors 132 and 134 after a certain period of time. The period of time may be substantially equal to the decay time of an equivalent resistor and capacitor circuitry (also known as the RC decay time). The multiplexers 160 and 162 select the voltage of one of the termination resistors 132 and 134, and TxVcm2 as the reference voltage. The comparator compares the selected voltages from the multiplexers 160 and 162. Then the comparator 164 may output the result to the core logic of the semiconductor device, which may output a signal to indicate the result.

Likewise, one can activate and/or deactivate the transistors 170–184 to select the appropriate voltage supplies and to isolate one or more circuit components, such as the current drivers 120, or the resistors 150 and 152, in order to test the one or more isolated circuit components.

Furthermore, additional DFT circuitry may be coupled between the 10 kΩ resistor 152 and the transistors 170–174 for the transmitter pin 112, as well as between the 10 kΩ resistor 150 and the transistors 176–180 for the transmitter pin 110. For instance, the exclusive-OR (XOR) circuitries for checking the connectivity of the device to a printed circuit board (PCB) may be added as described above. However, one should appreciate that other circuitries may be so added for other tests performed on the device. One advantage of adding DFT circuitry between the resistors 150 and 152 and the transistors 170–180 is to avoid disturbing the signal path for regular operations of the device.

Figure 2:
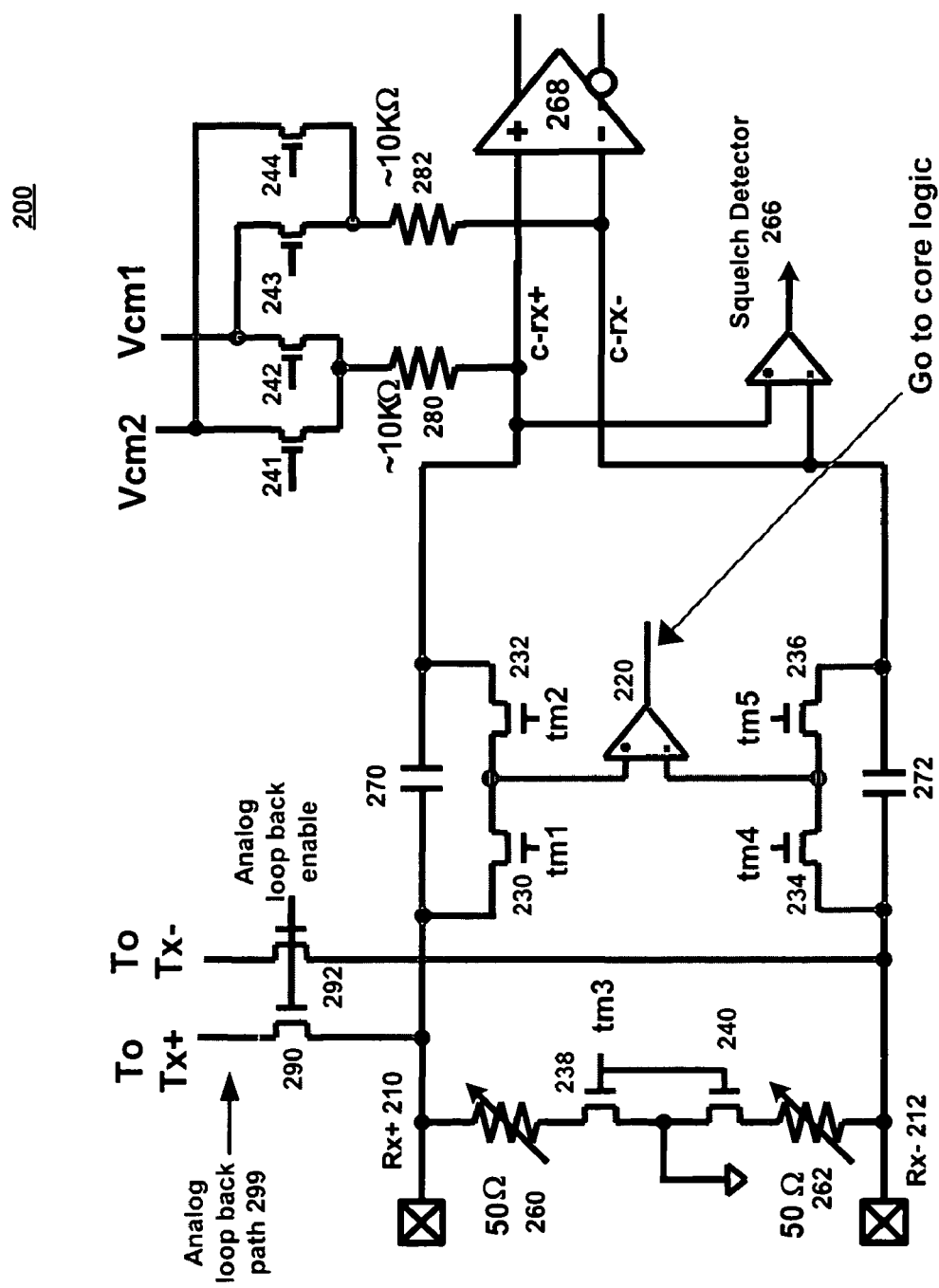
FIG. 2 shows one embodiment of testing circuitry coupled to a receiver.

FIG. 2 shows one embodiment of a receiver with DFT circuitry in an input/output interface of a semiconductor device. The receiver 200 includes a positive receiver pin 210, a negative receiver pin 212, a squelch detector 266, a comparator 268, two capacitors 270 and 272, and two termination resistors 260 and 262. In one embodiment, the termination resistors 260 and 262 are each at 50 ohms. The capacitors 270 and 272 may be at 5 pF each. The DFT circuitry of the receiver 200 includes another comparator 220 and a number of transistors 230–244 functioning as switches. The positive and negative receiver pins 210 and 212 are coupled to the positive and negative transmitter pins 110 and 112 (referring to FIG. 1), respectively, via the transistors 290 and 292. As discussed above, coupling the receiver pins 210 and 212 to the transmitter pins 110 and 112 provides an analog loop back path 299 to enable the semiconductor device to perform self-tests on the input/output interface of the semiconductor device.

Referring to FIG. 2, the transistors 238 and 240 couple the termination resistors 260 and 262 to the ground respectively. The transistors 241–244 couple the resistors 280 and 282 to one of the common mode voltage supplies, Vcm1 and Vcm2. For example, activating the transistor 242 and deactivating the transistor 241 put Vcm1 on the resistor 280. In one embodiment, each of the resistors 280 and 282 has a resistance of 10 kΩ. Transistors 230 and 232 are coupled to each end of the capacitor 270. Likewise, transistors 234 and 236 are coupled to each end of the other capacitor 272. The node in between the transistors 230 and 232 and the node in between the transistors 234 and 236 are input to the comparator 220. The output of the comparator 220 may go to the core logic of the semiconductor device.

In one embodiment, a receiver leakage test can be performed using the DFT circuitry of the receiver. For example, the positive receiver pin 210 may be tested for leakage by activating the transistor 242 to select Vcm1 to charge up the positive receiver pin 210. Then the transistors 236 and 244 are activated to put Vcm2 onto the other input of the comparator 220. The transistors 238 and 240 are deactivated to isolate the termination resistors 260 and 262 from the ground. In one embodiment, Vcm1 is substantially equal to Vcc/2 and Vcm2 is substantially within the range of Vcm1 plus 300 mV and Vcm1 minus 300 mV. If the voltage at the positive receiver pin 210 falls below the lower limit of the range of Vcm2, there is leakage at the positive receiver pin 210. Likewise, the negative receiver pin 212 may be tested for leakage by activating and/or deactivating the appropriate transistors to charge up the negative receiver pin 212 and to select a reference voltage to compare with the voltage at the negative receiver pin 212.

One should appreciate that the DFT circuitry in the semiconductor device enables the performance of other tests on the receiver 200. The transistors 230–244 allow various components of the receiver to be isolated and selected voltage supplies to be provided to the particular receiver component during testing. The comparator 220 may compare a voltage at a particular node of the receiver to a selected reference voltage. In addition to the receiver leakage test described above, other examples of receiver tests enabled by the DFT circuitry include a test on the receiver termination resistors 260 and 262, a test on the capacitors 270 and 272, and a leakage test on the comparator 266, etc.

Furthermore, additional DFT circuitry may be coupled between the transistors 230 and 232, as well as between the transistors 234 and 236 to implement other tests on the device. For instance, the XOR circuitries for checking the connectivity of the device to a PCB may be added between the transistors 230 and 232 and between the transistors 234 and 236. However, one should appreciate that other circuitries may also be added for other tests performed on the device. One advantage of adding DFT circuitry between the transistors 230 and 232, as well as the transistors 234 and 236, is that the signal path for regular operations of the device is not disturbed by the DFT circuitry added.

Using internal DFT circuitry to perform various receiver tests frees up tester channels for other usage, which is important for the legacy testers because the number of channels and the test speed of the legacy testers are limited. Furthermore, measuring signals within a semiconductor device with an internal comparator (e.g., the comparator 220 in FIG. 2) is generally faster and more accurate than using an external tester, especially for measuring small signals during the leakage tests.

FIG. 3 shows one embodiment of a semiconductor device 300 having a receiver 310 and a transmitter 320. The receiver 310 and the transmitter 320 are coupled to the receiver logic 330 and the transmitter logic 335 within the semiconductor device 300, respectively. Each of the receiver 310 and transmitter 320 is further coupled to the receiver and transmitter termination resistors 313 and 323 respectively. The transmitter termination resistors 323 are further coupled to a bias voltage supply, V_Bias, while the receiver termination resistors 313 are further coupled to the ground. In addition, the transmitter 320 is coupled to the receiver 310 via two external trace lines 340. In one embodiment, the trace lines 340 may be coupled to two AC coupling capacitors 345. The trace lines 340 provide an external data loop back path from the transmitter 320 to the receiver 310 to enable the transmitter 320 and the receiver 310 to perform self-tests, which may include various leakage tests.

Different values of capacitance may be chosen to perform a leakage test on the semiconductor device by coupling or decoupling the transmitter termination resistors 323, the current driver of the transmitter (not shown), and/or the receiver termination resistors 313. For example, each of the AC coupling capacitors 345 may provide a capacitance of 100 nF and each of the trace lines 340 may have a parasitic capacitance of 20 pF. Therefore, decoupling the current driver of the transmitter and coupling the transmitter and receiver termination resistors 323 and 313 may result in an effective capacitance of (20 pF+100 nF). The capability to select different capacitances provides flexibility to test development for the semiconductor device.

In one embodiment, the leakage from the transmitter 320 and/or the receiver 310 is relatively small. To shorten test time, the internal data loop back path is closed and the receiver termination resistors 313 are decoupled from the receiver 310 such that the signal from the transmitter 320 does not go through the trace lines 340 and the AC coupling capacitors 345. As a result, the effective capacitance becomes substantially equal to the parasitic capacitance of the trace lines 340, i.e., 20 pF in the above example.

Figure 4:
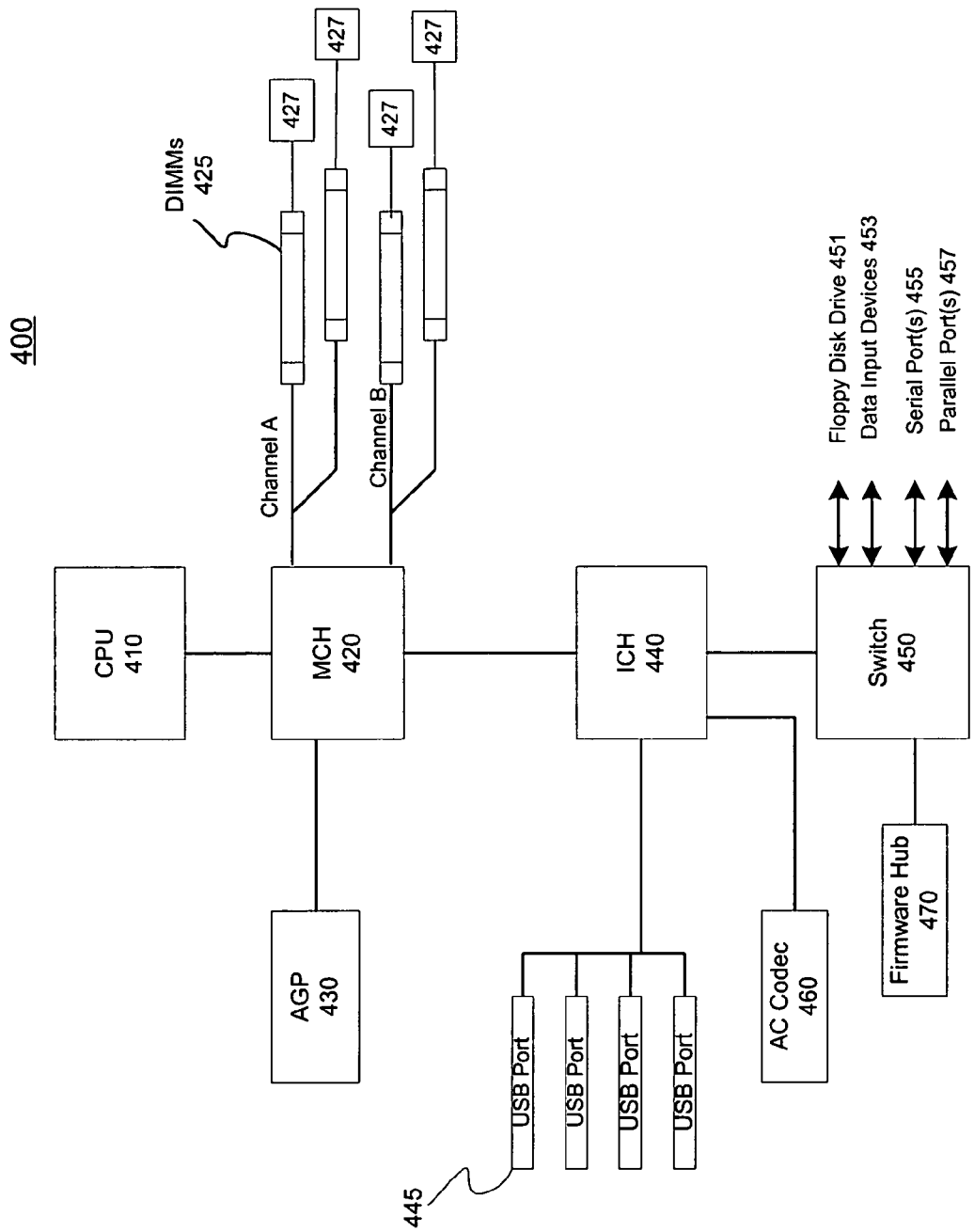
FIG. 4 shows an exemplary embodiment of a computer system.

FIG. 4 shows an exemplary embodiment of a computer system 400. The computer system 400 includes a central processing unit (CPU) 410, a memory controller (MCH) 420, a number of dual in-line memory modules (DIMMs) 425, a number of memory devices 427, an advance graphics port (AGP) 430, an input/output controller (ICH) 440, a number of Universal Serial Bus (USB) ports 445, an audio converter co-decoder (AC Codec) 460, a switch 450, and a firmware hub 470.

In one embodiment, the CPU 410, the AGP 430, the DIMMs 425, and the ICH 440 are coupled to the MCH 420. The MCH 420 routes data to and from the memory devices 427 via the DIMMs 425. The memory devices 427 may include various types of memories, such as, for example, dynamic random access memory (DRAM), synchronous dynamic random access memory (SDRAM), double data rate (DDR) SDRAM, or flash memory. In one embodiment, each of the DIMMs 425 is mounted on the same motherboard (not shown) via a DIMM connector (not shown) in order to couple to the MCH 420. In one embodiment, the USB ports 445, the AC Codec 460, and the switch 450 are coupled to the ICH 440. The switch 450 may be further coupled to a firmware hub 470, a floppy disk drive 451, data input devices 453, such as, a keyboard, a mouse, etc., a number of serial ports 455, and a number of parallel ports 457.

Note that any or all of the components and the associated hardware illustrated in FIG. 4 may be used in various embodiments of the computer system. However, it should be appreciated that other configuration of the computer system may include one or more additional devices not shown in FIG. 4. Furthermore, one should appreciate that the technique disclosed is applicable to different types of system environment, such as a multi-drop environment or a point-to-point environment.

The transmitter, receiver, and DFT circuitry described above with reference to FIGS. 1, 2, and 3 may be incorporated into the input/output interface of various devices in the computer system 400, such as, for example, the MCH 420, the ICH 440, or the switch 450. Incorporating the DFT circuitry allows the device to perform various tests on the input/output interface of the device without using any tester channel. Furthermore, the tests can be performed in a faster and more accurate manner than using an external tester, particularly those tests involving measurements of relatively small signals (e.g., leakage test). However, one should appreciate that the DFT circuitry illustrated in FIGS. 1, 2, and 3 are merely exemplary embodiments for illustrating the technique disclosed. The technique may be implemented with different configurations or combinations of circuitry in other embodiments.

The foregoing discussion merely describes some exemplary embodiments of the present invention. One skilled in the art will readily recognize from such discussion, the accompanying drawings and the claims that various modifications can be made without departing from the spirit and scope of the appended claims. The description is thus to be regarded as illustrative instead of limiting.

What is claimed is:

1. A semiconductor device comprising:
 a plurality of multiplexers to select one of a positive and a negative transmitter pins as a selected transmitter pin;
 a first comparator to compare a voltage of the selected pin with a first reference voltage to determine whether there is leakage at the selected pin;
 a first plurality of termination resistors coupled to the positive transmitter pin; and
 a second plurality of termination resistors coupled to the negative transmitter pin such that each of the first and second pluralities of termination resistors are tested with the first reference voltage and the first comparator.

2. The semiconductor device of claim 1, further comprising core logic circuitry to receive an output of the first comparator.

3. The semiconductor device of claim 1, further comprising a positive receiver pin and a negative receiver pin coupled to the positive and negative transmitter pins, respectively, to provide an analog loop back path.

4. A method to test an input/output of a semiconductor device, the method comprising:
 selecting one of a positive transmitter pin and a negative transmitter pin as a selected transmitter pin;

comparing a voltage at the selected transmitter pin with a first reference voltage using a first comparator in the semiconductor device to determine whether there is leakage at the selected transmitter pin;

selecting one or more of a plurality of termination resistors as selected termination resistors; and testing the selected termination resistors with the first reference voltage and the first comparator.

5. The method of claim 4, further comprising selecting the first reference voltage out of a plurality of voltage supplies.

6. The method of claim 4, further comprising:

coupling a positive receiver pin and a negative receiver pin in the semiconductor device to the positive and negative transmitter pins, respectively, to provide an analog loop back path within the semiconductor device; and sending a test pattern from the positive and negative transmitter pins to the positive and negative receiver pins.

7. A computer system comprising:

a plurality of dynamic random access memory devices (DRAM); and a chipset coupled to the plurality of DRAMs, the chipset including a semiconductor device that comprises a plurality of multiplexers to select one of a positive and a negative transmitter pins as a selected transmitter pin;

a first comparator to compare a voltage of the selected pin with a first reference voltage to determine whether there is leakage at the selected pin;

a first plurality of termination resistors coupled to the positive transmitter pin; and a second plurality of termination resistors coupled to the negative transmitter pin such that each of the first and second pluralities of termination resistors are tested using the first reference voltage and the first comparator.

8. The computer system of claim 7, wherein the semiconductor device further comprises a positive receiver pin and a negative receiver pin coupled to the positive and negative transmitter pins, respectively, to provide an analog loop back path.

9. The computer system of claim 7, wherein the semiconductor device is a memory controller.

10. The computer system of claim 7, wherein the semiconductor device is an input/output controller.

11. The computer system of claim 7, further comprising a processor coupled to the chipset.

* * * * *

UNITED STATES PATENT AND TRADEMARK OFFICE
CERTIFICATE OF CORRECTION

| | | |
|---|---|---|
| PATENT NO. | : 7,002,365 B2 | Page 1 of 1 |
| APPLICATION NO. | : 10/749629 | |
| DATED | : February 21, 2006 | |
| INVENTOR(S) | : Kakizawa et al. | |

It is certified that error appears in the above-identified patent and that said Letters Patent is hereby corrected as shown below:

In column 1, at line 36, before "limited" insert --with the--.

Signed and Sealed this

Twenty-seventh Day of November, 2007

JON W. DUDAS
*Director of the United States Patent and Trademark Office*